United States Patent
Lin et al.

(10) Patent No.: US 6,225,155 B1
(45) Date of Patent: May 1, 2001

(54) METHOD OF FORMING SALICIDE IN EMBEDDED DYNAMIC RANDOM ACCESS MEMORY

(75) Inventors: Yung-Chang Lin, Feng-Yuan; Tung-Po Chen, Taichung; Jacob Chen, Hsinchu, all of (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/208,602

(22) Filed: Dec. 8, 1998

(51) Int. Cl.⁷ ............................................. H01L 21/8234
(52) U.S. Cl. ................... 438/238; 438/229; 438/231; 438/649; 438/721
(58) Field of Search .................... 438/238, 229, 438/231, 649, 721

(56) References Cited

U.S. PATENT DOCUMENTS

| | | | |
|---|---|---|---|
| 5,508,212 | * 4/1996 | Wang et al. | 437/24 |
| 5,691,212 | * 11/1997 | Tsai et al. | 437/24 |
| 5,963,829 | * 10/1999 | Matsubara | 438/649 |
| 6,020,240 | * 2/2000 | Wu | 438/275 |
| 6,025,274 | * 2/2000 | Lin et al. | 438/721 |
| 6,030,863 | * 2/2000 | Chang et al. | 438/229 |
| 6,037,204 | * 3/2000 | Chang et al. | 438/231 |

\* cited by examiner

Primary Examiner—Vu A. Le
Assistant Examiner—Pho Luu (57) ABSTRACT

In a method of forming a salicide layer in an embedded dynamic random access memory, a thin oxide layer, a silicon nitride layer and a thick oxide layer are sequentially formed over a substrate after performing an annealing process to a source/drain region. The insulating layer on a gate and a source/drain region in a logic region and a gate in a memory region. Salicide layers are formed on the three regions mentioned above. Formation of the salicide layers can lower resistance of the three regions, increase speed and can avoid forming a salicide layer on the source/drain region in the memory region. Thus, current leakage can be avoided. In addition, the step of forming a salicide layer is conducted after the annealing process of the source/drain region, so problems of thermal stability and inter-diffusion of impurities in the polysilicon layer can also be solved.

16 Claims, 7 Drawing Sheets

METHOD OF FORMING SALICIDE IN EMBEDDED DYNAMIC RANDOM ACCESS MEMORY

BACKGROUND OF THE INVENTION

1. Field of the Invention

The present invention relates to a semiconductor process. More particularly, the present invention relates to a method of forming a salicide layer in an embedded dynamic random access memory (DRAM).

2. Description of Related Art

An embedded dynamic random access memory (DRAM) has a logic region and a random access memory region (called memory region hereinafter). A gate of a traditional logic region comprises an N-type metal oxide semiconductor field effect transistor (n-MOSFET) formed from N-type doped polysilicon and P-type MOS field effect transistor (p-MOSFET) to form a CMOS structure. The phenomenon of punch through and turnoff characteristics are easily generated in a PMOS with an N-type doped polysilicon gate. Therefore, an NMOS having an N-type polysilicon gate and a dual gate of PMOS having an P-type polysilicon gate are gradually used in the logic region to lower the bad effects mentioned above.

A salicide layer cannot be formed on a source/drain region of an embedded DRAM in order to avoid serious current leakage occurring on the source/drain region of the embedded DRAM. Therefore, a tungsten silicide layer is provided on a polysilicon layer to lower resistance of the gate and to increase conductivity of the gate. However, some problems also arise when a dual gate of the embedded DRAM is formed by the tungsten silicide layer on the polysilicon layer to reduce the resistance of the dual gate, as shown in FIGS. 1A to 1D.

Figure 1A:
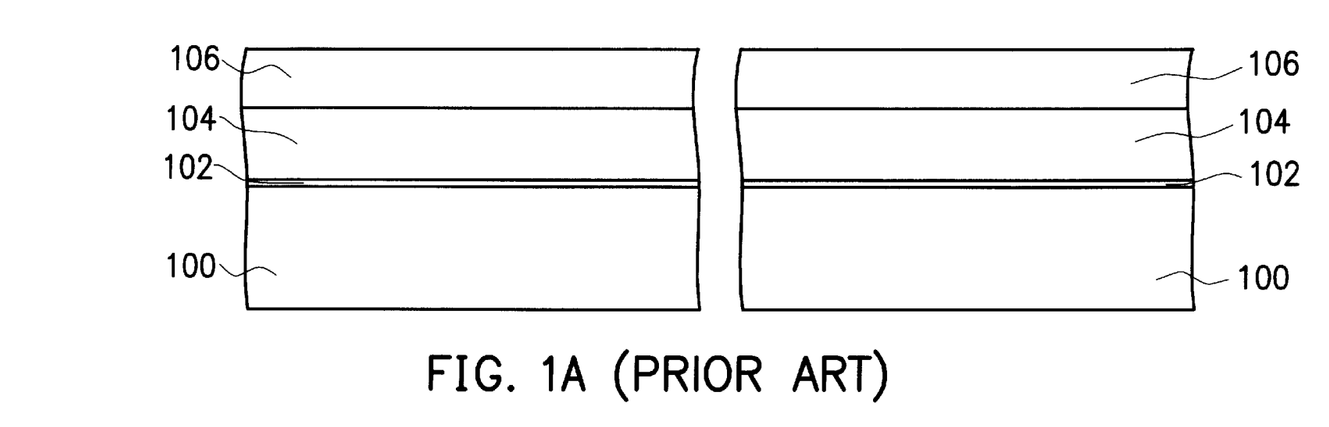
FIGS. 1A to 1D are schematic, cross-sectional views showing a conventional method of fabricating an embedded DRAM.
Figure 1B:
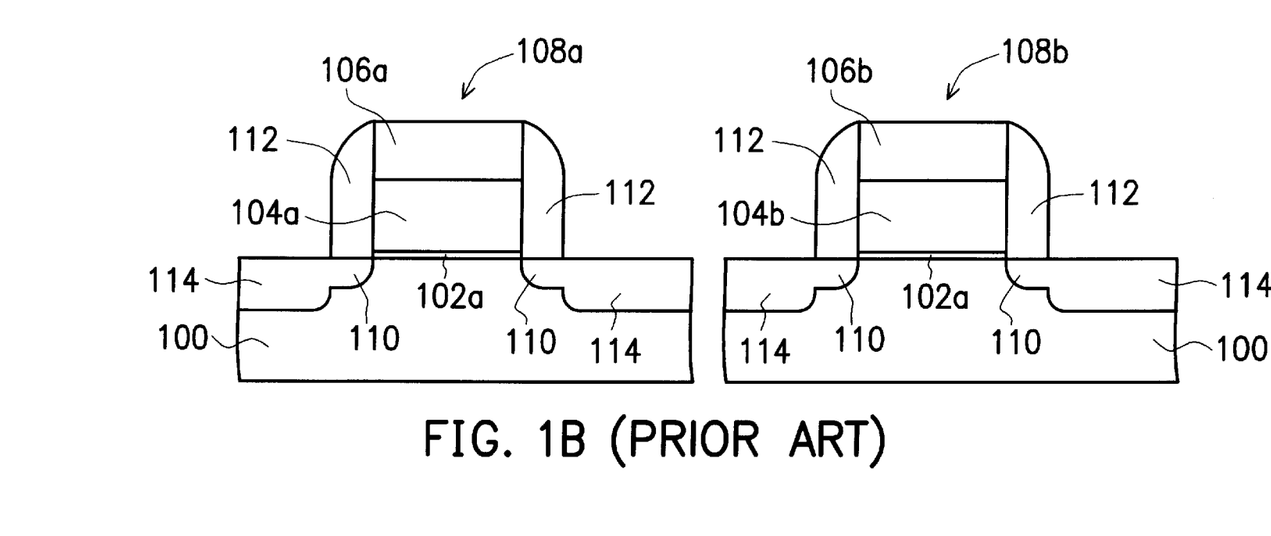

FIGS. 1A to 1D are schematic, cross-sectional views showing a conventional method of fabricating an embedded DRAM. Referring to FIG. 1A, a gate oxide layer 102 and a polysilicon layer 104 are sequentially formed on a substrate 100. Ion implantation steps using N-type ions and P-type ions are respectively performed in the polysilicon layer 104, using a mask. A tungsten silicide layer 106 is formed on the polysilicide layer 104 to increase conductivity of a gate formed in a later process. The tungsten silicide layer 106, a dual gate 108a and a gate 108b are formed by defining the tungsten silicide layer 106, the polysilicon layer 104 and the gate oxide layer 102, as shown in FIG. 1B.

Figure 2:
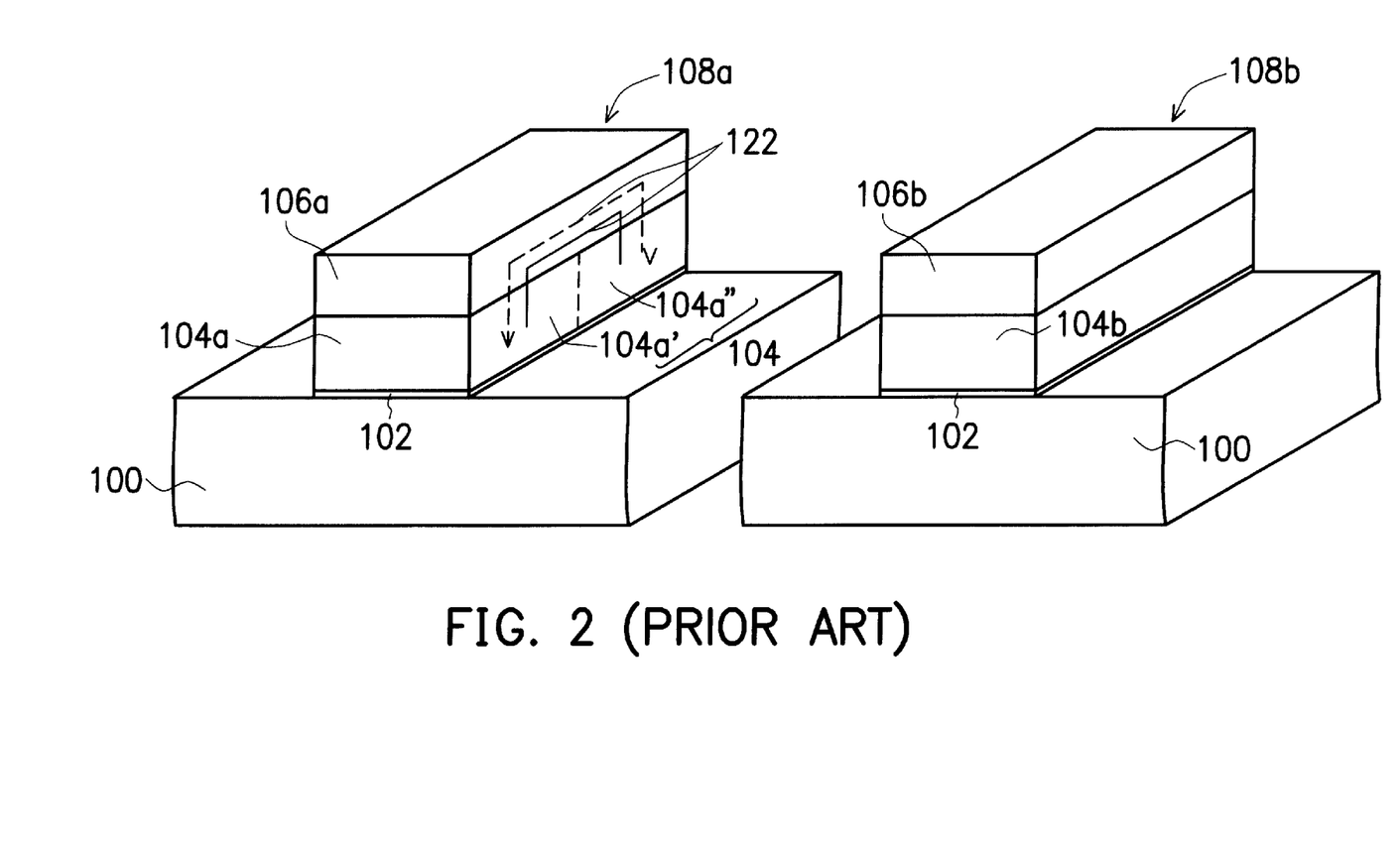
FIG. 2 is a schematic, three-dimensional diagram showing a dual gate 108a and a gate 108b according to FIG. 1B.

FIG. 2 is a schematic, three-dimensional diagram showing a dual gate 108a and a gate 108b according to FIG. 1B. The dual gate 108a has an N-type polysilicon layer 104a' and a P-type polysilicon layer 104a''. The gate 108b has an N-type polysilicon layer 104b. An N-type doped drain (LDD) region 110 and P-type LDD region 110 are respective formed in the substrate 100. Silicon nitride spacers 112 are formed on sidewalls of the gates 108a, 108b. An ion implantation step is performed in the substrate 100 to respectively form an N-type source/drain region 114 and P-type source/drain region 114. A rapid thermal process (RPT) is performed at about 1000° C. to activate ions of the source/drain regions 114.

Figure 1C:
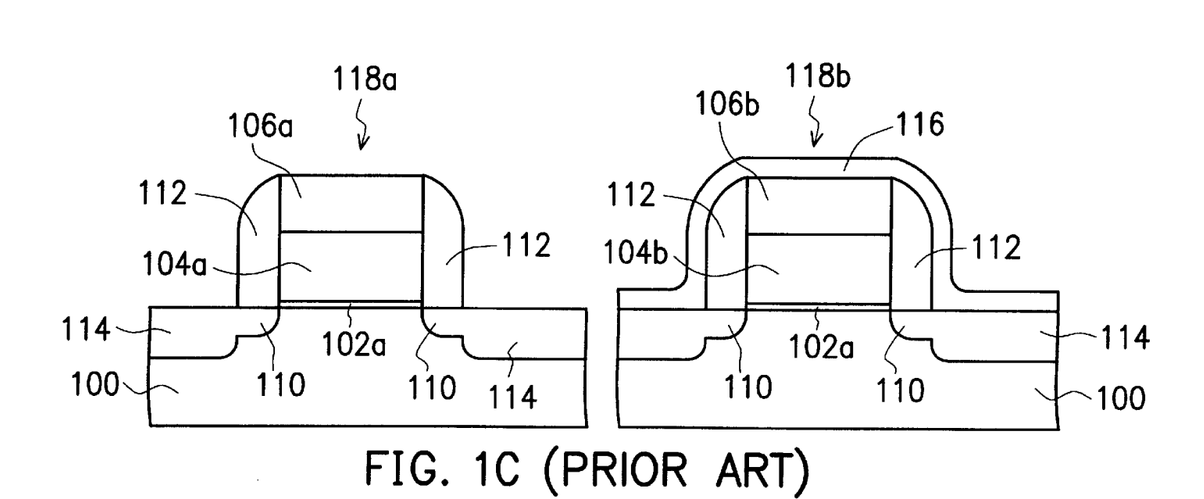

As shown in FIG. 1C, the substrate 100 is covered with an oxide layer 116. The oxide layer 116 is defined using a mask to make the oxide layer 116 cover only a portion of the substrate 100. The portion not covered with the oxide layer 116 is defined as a logic region 118a, and the other portion covered with the oxide layer 116 is defined as a memory region 118b.

Figure 1D:
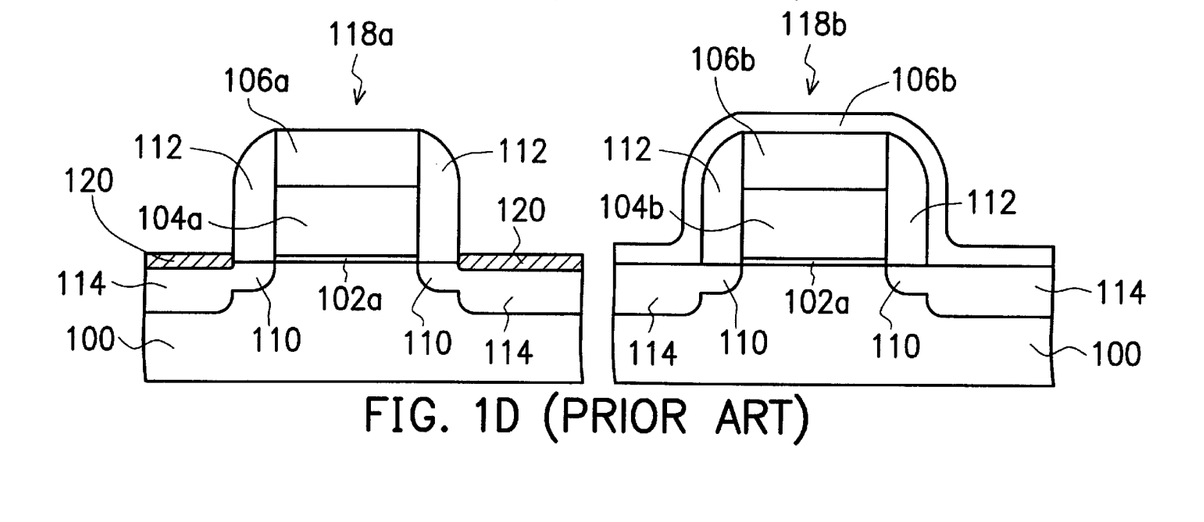

A titanium layer is formed over the substrate 100. A RTP is performed to make the titanium layer to react with the exposed substrate 100. Titanium silicide layers 120 are formed on the exposed source/drain region 114 in the logic region 118a, as shown in FIG. 1D.

In the process mentioned above, the purpose of forming the tungsten silicide layer 106 is to increase conductivity of the polysilicon layer 104. While performing the RTP, the high temperature and larger diffusion coefficient of impurities in the tungsten silicide layer will lead to some bad effects for the dual gate in the logic region. Due to the conditions mentioned above, the N-type impurities in the polysilicon layer 104a' of the dual gate diffuse into the P-type polysilicon layer 104a'' through the tungsten silicide layer 106. The P-type impurities in the polysilicon layer 104a'' also diffuse into the N-type polysilicon layer 104a' through the tungsten silicide layer 106. Thus, inter-diffusion occurs in the dual gate, as shown in FIG. 2. The inter-diffusion will cause the dual gate to fail.

In addition, a definition step must be performed on the tungsten silicide layer 106 and the polysilicide layer 104 in order to form the gate. It is more difficult to perform the definition step due to the presence of the tungsten silicide layer 104.

SUMMARY OF THE INVENTION

Accordingly, the present invention provides a method for avoiding inter-diffusion in a dual gate to ensure reliability of a device.

Another aspect of the invention is to form a salicide layer on a gate, a source/drain region in a logic region, and on a gate in a memory region in order to increase conductivity of the gates.

To achieve these and other advantages and in accordance with the purpose of the invention, as embodied and broadly described herein, the invention provides a method of forming a salicide layer in an embedded DRAM. A dual polysilicon gate is formed on a substrate in a logic region, and a gate is formed on a substrate in a memory region. An insulating layer, a hard material layer and a dielectric layer are sequentially formed over the substrate. An etching back process, a definition process and an etching process are sequentially performed to expose the dual gate and the source/drain region in the logic region and the gate in the memory region. Salicide layers are formed on the exposed dual gate, the exposed source/drain region in the logic region and the exposed gate in the memory region. An annealing process is performed on the source/drain region before forming the salicide layers, therefore, the thermal process will not be performed in the later processes. Inter-diffusion and thermal instability problems can be avoided. Therefore, the invention provides a method for increasing conductivity of the gates to form the salicide layers on the dual gate, the source/drain region in the logic region, and the gate in the memory region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In a conventional method of forming a dual gate, a tungsten silicide layer is provided on a polysilicon layer to increase conductivity of the dual gate. However, the tungsten silicon layer causes more difficulties for defining the gate. When performing a later thermal process, N-type ions and P-type ions in the dual gate diffuse toward each other through the tungsten silicide layer to generate inter-diffusion. Inter-diffusion will cause a dual gate to fail. Therefore, the invention provides a method of forming a salicide layer in an embedded DRAM. Salicide layers are formed on the dual gate, the source/drain region in the logic region, and the gate in the memory region to increase the conductivity of the dual polysilicon gate without forming a tungsten silicide layer. Therefore, inter-diffusion occurring in the conventional method can be avoided. The difficulties of the processes are reduced because formation of the tungsten silicide layer is not necessary.

Figure 3A:
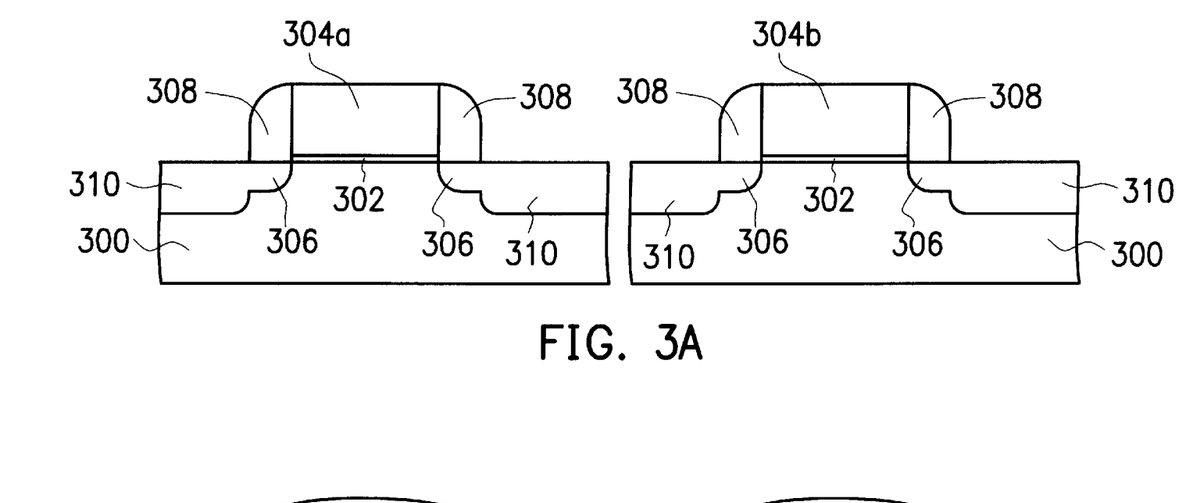
FIGS. 3A to 3G are schematic, cross-sectional views showing a method of fabricating an embedded DRAM according to the preferred embodiment of this invention.

FIGS. 3A to 3G are schematic, cross-sectional views showing a method of fabricating an embedded DRAM according to the preferred embodiment of this invention. Referring to FIG. 3A, a gate oxide layer 302 is formed on a substrate 300 having a shallow trench isolation (STI) structure (not shown). The trench is formed by oxidation, preferably by a thermal oxidation process. A polysilicon layer is formed over the substrate 300 by deposition, such as low-pressure chemical vapor deposition (LPCVD) using $SiH_4$ as reacting gas. Ion implantation steps with N-type ions and P-type ions are respectively performed in the polysilicon layer using a mask. The polysilicon layer is defined to form a dual gate 304a and a gate 304b, as shown in FIG. 3A. A lightly doped drain (LDD) 306 region is formed in the substrate 300 by an ion implantation process. Spacers 308 are formed on sidewalls of the dual gate 304a and the gate 304b. For example, a silicon nitride layer is formed over the substrate, and then the silicon nitride layer is etched back to form the spacers 308. An ion implantation step is again performed in the substrate 300. Source/drain regions 310 are formed in the substrate 300 through an annealing process at high temperature.

Figure 3B:
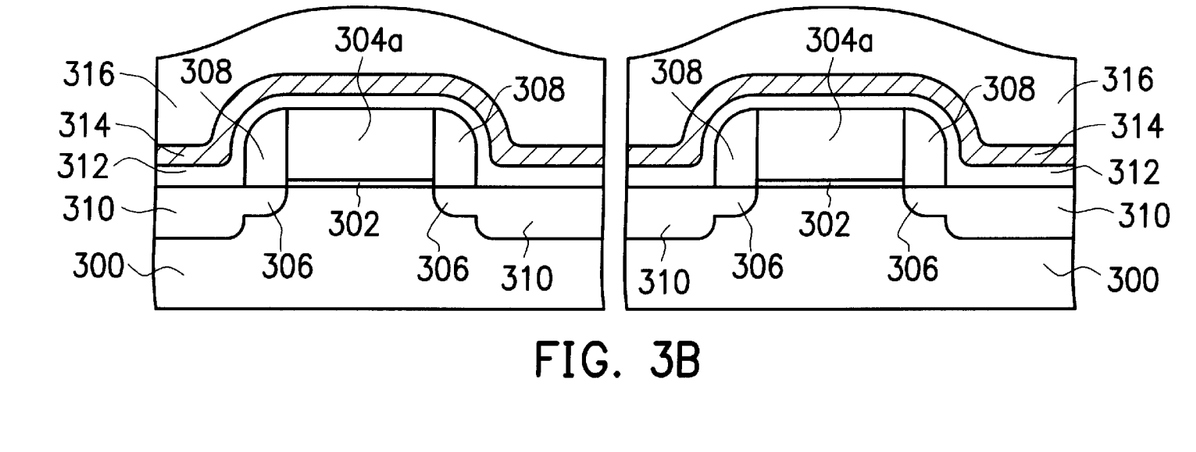

Referring to FIG. 3B, an insulating layer 312 is formed over the substrate 300. Preferably, the insulating layer 312 comprises an oxide layer with a thickness of about 500–1000 Å formed by CVD. Then, a hard material layer 314 is formed on the insulating layer 314. Preferably, hard material layer 314 comprises a silicon nitride layer or the like formed by LPCVD or plasma-enhanced CVD (PECVD). A thicker inter-layer dielectric (ILD) layer 316 is formed on the hard material layer 314. The dielectric layer 316 comprises a phosphosilicate glass (PSG) layer or a borophosphosilicate phosphosilicate glass (BPSG) layer. A chemical mechanical polishing (CMP) method or a spin-on glass (SOG) process is performed for planarization.

Figure 3C:
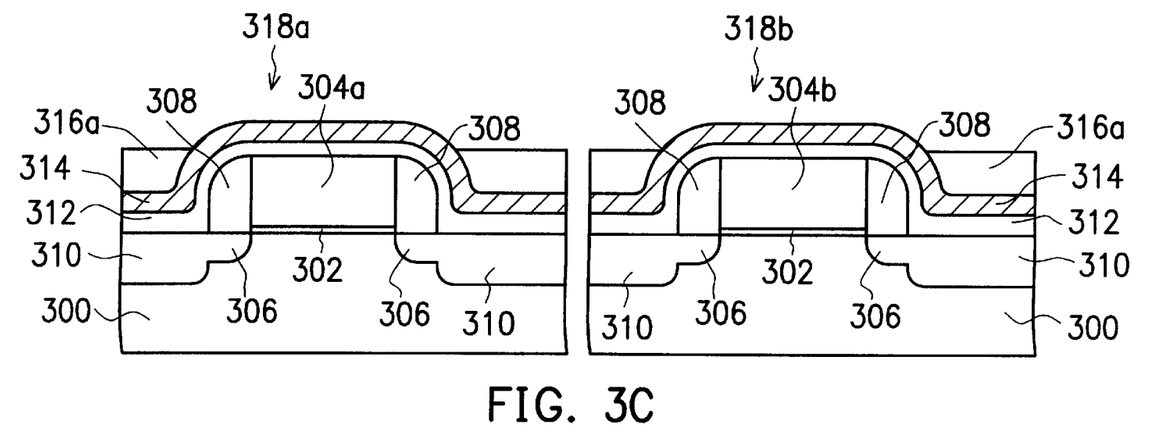
Figure 3D:
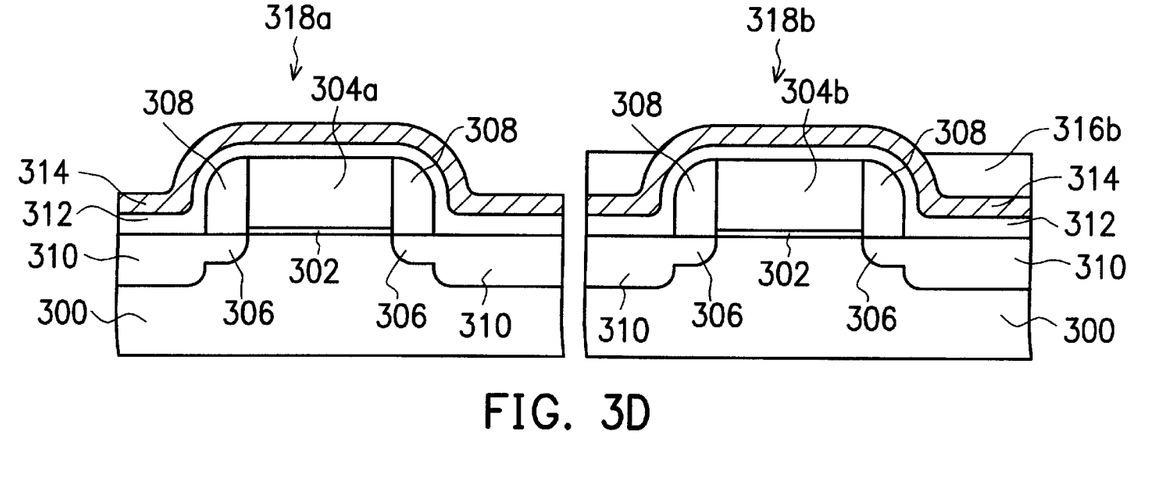

A portion of the ILD layer 316 is removed by etching back to expose a portion of the hard material layer 314 on the gate, as shown in FIG. 3C. A portion of the substrate 300 is covered with a mask layer (not shown), such as a photoresist layer, to define an ILD layer 316a (the remaining portion of ILD layer 316) by a photolithography process and etching process. Thus, the substrate 300 is defined as a logic region 318a and a memory region 318b. The ILD layer 316a in the logic region 318a is removed by an etching process, such as a dry etching process, to entirely expose the hard material layer 314 in the logic region 318a. In this step, the hard material layer 314 serves as an etching stop, as shown in FIG. 3D. The ILD layer 316b still remains on the memory region 318b due to protection by a mask layer.

Figures 3E, 3F:
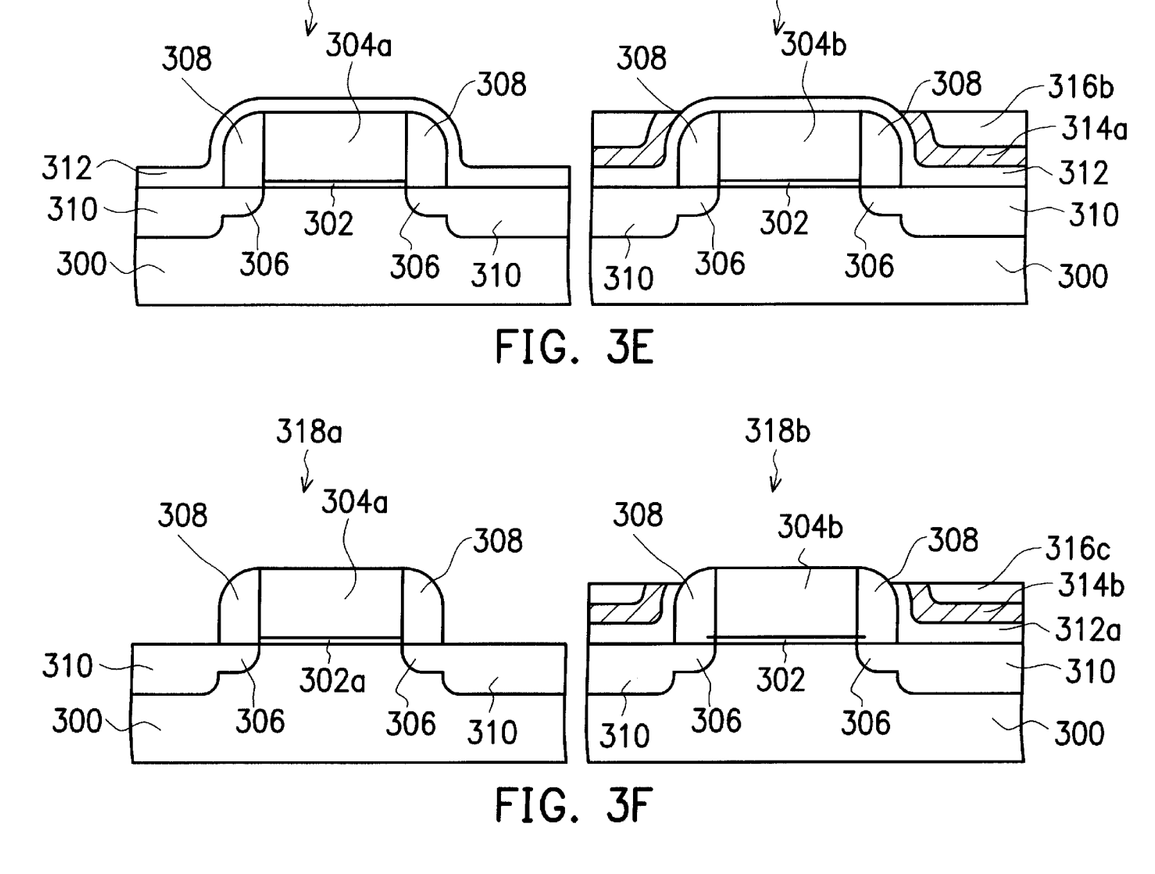

The exposed hard material layer 314 in FIG. 3D is removed by etching so as to expose the insulating layer 312 in the logic region 318a and also to expose a portion of the insulating 312 in the memory region 318b, as shown in FIG. 3E. The exposed portion of the insulating layer 312 in the memory region 318b is substantially defined by the ILD layer 316b. Then, the exposed insulating layer 312 in the logic region 318a is removed to expose the source/drain region 310 in the substrate 300 and the dual gate 304a with doped polysilicon, as shown in FIG. 3F. Additionally, the polysilicon gate 304b is also exposed in the memory region 318b by removing the exposed portion of the insulating layer 312 in the memory region 318a. Because the depositing thickness of the insulating layer 312a can be controlled accurately, the etched thickness of the insulating layer 312a can be also controlled accurately while performing the etching step. Therefore, the insulating layer 321a will not be over-etched, and recesses generated on the STI structure can be avoided, which improves the performance of devices.

Figure 3G:
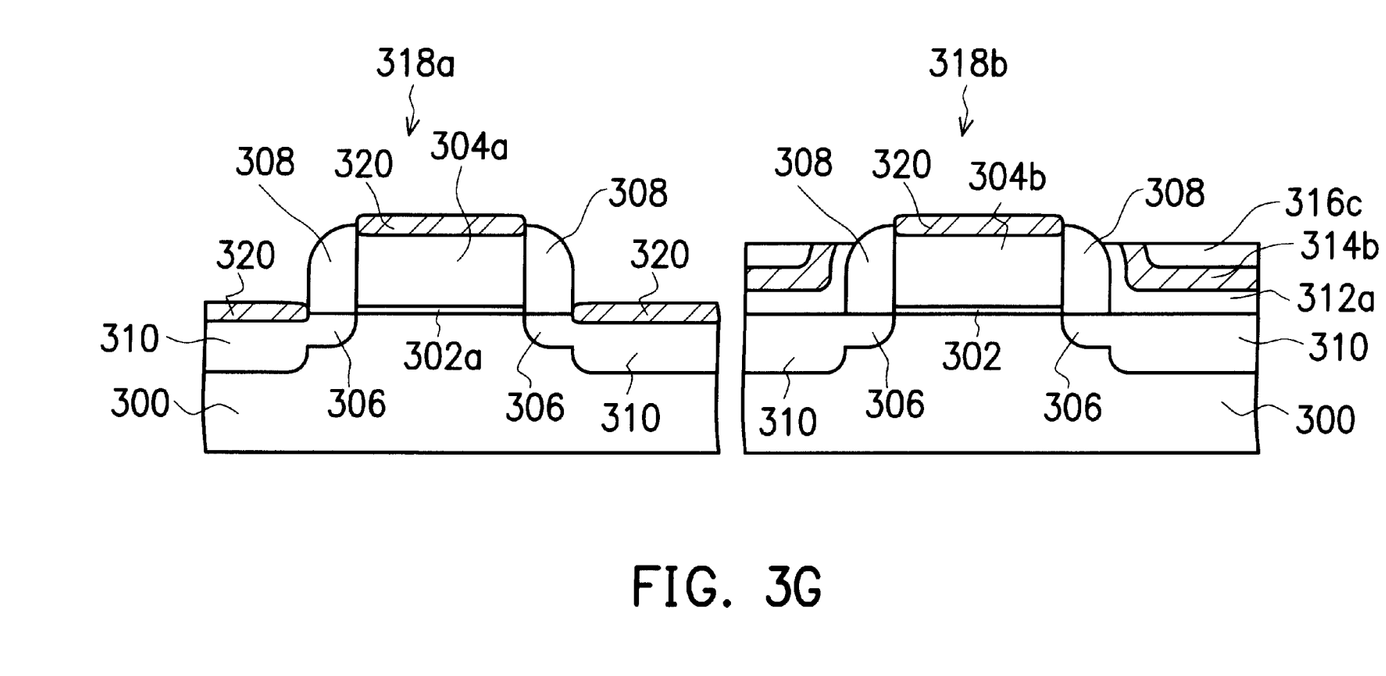

A metal layer is formed to cover the substrate 300. Through a thermal process at high temperature, the metal layer reacts with the exposed substrate 300 and the polysilicon layers to form salicide layers. Thus, salicide layers 320 are respectively formed on the source/drain region 310 in the logic region 318a, the dual gate 304a in the logic region 318a, and the gate 304b in the memory region 318b, as shown in FIG. 3G. The metal layer includes a titanium layer, and the salicide layers include $TiSi_x$. The required processes of forming a capacitor are subsequently performed by conventional methods.

In the invention, the dual gate is formed using a polysilicon layer, and the step of annealing at high temperature on the source/drain region is finished before forming the salicide layers. Therefore, inter-diffusion caused by a thermal process at high temperature can be avoided. The salicide layers are formed on the source/drain region in the logic region, the dual gate and the gate in the memory region. Thus, resistance of the gate can be minimized. Leakage current is also eliminated because the salicide layers are not formed on the source/drain region in the memory region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a salicide layer in an embedded dynamic random access memory, comprising the steps of:
   providing a substrate having a memory region and a logic region;
   forming a dual polysilicon gate in the logic region and a polysilicon gate on the memory region, wherein the dual polysilicon gate and the polysilicon gate respectively have source/drain regions;
   forming an insulating layer over the substrate;
   forming a hard material layer on the insulating layer;
   forming an inter-layer dielectric layer over the substrate;
   etching back a portion of the inter-layer dielectric layer to expose a portion of the hard material layer;
   removing a portion of the inter-layer dielectric layer in the logic region to further expose the hard material layer in the logic region;
   removing the exposed portion of the hard material layer to expose the insulating layer in the logic region and the insulating layer in the memory region about above the polysilicon gate;
   removing the exposed portion of the insulating layer to expose the dual polysilicon gate and the source/drain region in the logic region, and the polysilicon gate in the memory region; and
   forming a salicide layer on the dual polysilicon gate, the source/drain region in the logic region, and the polysilicon gate in the memory region.

2. The method according to claim 1, wherein the step of forming the dual polysilicide gate in the memory region and the polysilicon gate in the logic region comprises:
   forming a gate oxide layer and a polysilicon layer on the substrate;
   sequentially performing a P-type ion implantation step and an N-type ion implantation step in the polysilicon layer using a mask;
   defining the polysilicon layer to form the dual polysilicon gate and the polysilicon gate; and
   forming spacers beside the dual polysilicon gate and the polysilicon gate, respectively.

3. The method according to claim 1, wherein the insulating layer comprises an oxide layer.

4. The method according to claim 1, wherein the hard material layer comprises a silicon nitride layer.

5. The method according to claim 1, further comprising a chemical mechanical polishing process for the inter-layer dielectric layer planarization after the step of forming the inter-layer dielectric layer.

6. The method according to claim 1, wherein the step of forming the inter-layer dielectric layer comprises a spin-on glass method.

7. The method according to claim 1, wherein the step of etching back a portion of the inter-layer dielectric layer comprises a dry etching method using the hard material layer as an etching stop.

8. The method according to claim 1, wherein the step of removing the inter-layer dielectric layer in the logic region comprises covering the memory region with a mask and removing the inter-layer dielectric layer in the logic region to expose the hard material layer in the logic region using the hard material layer as an etching stop.

9. The method according to claim 1, wherein the step of removing the exposed insulating layer comprises performing a dry etching method so that etched thickness of the insulating layer is substantially the same as depositing thickness of the insulating layer.

10. The method according to claim 1, wherein the step of forming the salicide layer on the dual gate, the source/drain region in the logic region, and the gate in the memory region comprises:
    forming a metal layer over the substrate; and
    performing a thermal process to make the metal layer react with the exposed dual gate, the source/drain region and the gate to form the salicide layer.

11. The method according to claim 1, wherein the insulating layer is from about 500 Å to about 1000 Å thick.

12. A method of forming a salicide layer in an embedded dynamic random access memory, comprising the steps of:
    providing a substrate having a memory region and a logic region;
    forming a first polysilicon gate with a dual gate structure in the logic region and a second polysilicon gate on the memory region, wherein the first polysilicon gate and the second polysilicon gate respectively have source/drain regions;
    forming an insulating layer over the substrate;
    forming a silicon nitride layer on the insulating layer;
    forming an inter-layer dielectric layer over the substrate;
    etching back a portion of the inter-layer dielectric layer to expose a portion of the silicon nitride layer;
    removing a portion of the inter-layer dielectric layer in the logic region to further expose the silicon nitride layer in the logic region;
    removing the exposed portion of the silicon nitride layer to expose the insulating layer in the logic region and the insulating layer in the memory region about above the second polysilicon gate;
    removing the exposed portion of the insulating layer to expose the first polysilicon gate and the source/drain region in the logic region, and the second polysilicon gate in the memory region; and
    forming a salicide layer on the first polysilicon gate, the source/drain region in the logic region, and the second polysilicon gate in the memory region.

13. The method according to claim 12, further comprising a chemical mechanical polishing process for the inter-layer dielectric layer planarization after the step of forming the inter-layer dielectric layer.

14. The method according to claim 12, wherein the step of forming the inter-layer dielectric layer comprises a spin-on glass method.

15. The method according to claim 12, wherein the step of etching back a portion of the inter-layer dielectric layer comprises a dry etching method using the hard material layer as an etching stop.

16. The method according to claim 12, wherein the step of removing the inter-layer dielectric layer in the logic region comprises covering the memory region with a mask and removing the inter-layer dielectric layer in the logic region to expose the hard material layer in the logic region using the hard material layer as an etching stop.

* * * * *